US012732198B2

(12) United States Patent
Kim et al.

(10) Patent No.: US 12,732,198 B2
(45) Date of Patent: Sep. 8, 2026

(54) DUAL MODE CLOCK AND DATA RECOVERY CIRCUIT USING OVERSAMPLING OR BAUD RATE AND METHOD OF OPERATING SAME

(71) Applicant: KOREA UNIVERSITY RESEARCH AND BUSINESS FOUNDATION, Seoul (KR)

(72) Inventors: Chulwoo Kim, Seoul (KR); Seung-Woo Park, Seoul (KR); Jong-Hyuck Choi, Suwon-si (KR); Hwaseok Shin, Seoul (KR); Tae-Hwan Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 35 days.

(21) Appl. No.: 18/883,086

(22) Filed: Sep. 12, 2024

(65) Prior Publication Data

US 2025/0211240 A1 Jun. 26, 2025

(30) Foreign Application Priority Data

Dec. 26, 2023 (KR) ........................ 10-2023-0191637

(51) Int. Cl.

| | |
|---|---|
| ***H03L 7/091*** | (2006.01) |
| ***H03L 7/08*** | (2006.01) |
| ***H03L 7/093*** | (2006.01) |
| ***H04L 7/033*** | (2006.01) |

(52) U.S. Cl.

CPC ............ *H03L 7/091* (2013.01); *H03L 7/0807* (2013.01); *H03L 7/093* (2013.01); *H04L 7/033* (2013.01)

(58) Field of Classification Search

CPC ....... H03L 7/091; H03L 7/0807; H03L 7/093; H04L 7/033

See application file for complete search history.

(56) References Cited

U.S. PATENT DOCUMENTS

| | | | | |
|---|---|---|---|---|
| 12,289,105 | B2 * | 4/2025 | Choi | H03L 7/087 |
| 2007/0064850 | A1 * | 3/2007 | Tamura | H04L 7/033 375/375 |
| 2010/0299462 | A1 * | 11/2010 | Yen | G06F 13/423 710/61 |

(Continued)

FOREIGN PATENT DOCUMENTS

| | | | |
|---|---|---|---|
| KR | 10-1252191 | B1 | 4/2013 |
| KR | 10-1337268 | B1 | 12/2013 |
| KR | 10-2022-0091880 | A | 7/2022 |

*Primary Examiner* — Janice N Tieu

(74) *Attorney, Agent, or Firm* — Hauptman Ham, LLP

(57) ABSTRACT

Disclosed are a clock and data recovery circuit and a method of operating the same. The clock and data recovery circuit includes an analog front end that receives an external signal and outputs a non-zero return (NRZ) signal, a comparison unit that receives the NRZ signal and compares the NRZ signal with a reference voltage to generate a phase of the external signal and data; a phase detector that determines a transmission rate of the data based on the phase and generates a first recovery signal and a second recovery signal based on the transmission rate of the data; and an oscillator that generates a first clock in an oversampling scheme based on the first recovery signal and generates a second clock in a baud rate scheme based on the second recovery signal.

10 Claims, 12 Drawing Sheets

(56) References Cited

U.S. PATENT DOCUMENTS

2017/0163410 A1* 6/2017 Rommel ............... H04L 7/0334
2018/0343011 A1* 11/2018 Tajalli ..................... H03L 7/089
2019/0305926 A1* 10/2019 Li ......................... H04L 7/0337

* cited by examiner

10
External Signal
100
Analog Front End
NRZ Signal
200
Comparison Unit
Phase Data
300
Phase Detector
First Recovery Signal
Second Recovery Signal
400
Oscillator
Clock

FIG. 2

| Data-rate [Gb/s] | 1/4-rate CK[GHz] |
|---|---|
| 2 | 1 |
| 4 | 2 |
| 8 | 2 |

- $V_{OUT}$ +
$V_B$
<2:0>
103f x2
44f x2
22f x2
CCTBB<2>
CCTBB<1>
CCTBB<0>
VSS
SSA
+ $V_{IN}$ -

10A
100
200
300
400
500
$D_{IN}$
$DB_{IN}$
2-stage CTLE
VGA
CTLE_CAP<3:0>
Adaptation engine
510
520
530
540
EQ Logic
$V_{CM}$ Logic
$V_{REF}$ Logic
RDAC
From COMPs output
$V_{REFP,N}$
CKC
CKA
CKD
CKB
Frequency-locked logic
Dual-mode FD
2:8
FLL Logic
mode_sel
Phase-locked logic
Dual-mode PD
2:16
INT Logic
$K_P$
$K_I$
1-2GHz DCO
CAP Array
256
8
Phase Sel.
4
CKA,B,C,D

DUAL MODE CLOCK AND DATA RECOVERY CIRCUIT USING OVERSAMPLING OR BAUD RATE AND METHOD OF OPERATING SAME

CROSS-REFERENCE TO RELATED APPLICATIONS

This application claims priority under 35 U.S.C. § 119 to Korean Patent Application No. 10-2023-0191637 filed on Dec. 26, 2023, in the Korean Intellectual Property Office, the disclosures of which are incorporated by reference herein in their entireties.

BACKGROUND

Embodiments of the present disclosure described herein relate to a dual-mode clock and data recovery circuit using oversampling or baud rate and a method of operating the same.

A conventional clock and data recovery circuit has mainly used 2× oversampling or baud rate. 2× oversampling is a scheme that restores clock and data by using a frequency higher than that of an input signal, but increases power consumption due to the high frequency.

In addition, the baud rate is a scheme that restores clock and data by using the ratio of the frequency of an input signal and the frequency of a clock signal, but when the channel loss is small, the accuracy of restoration decreases.

SUMMARY

Embodiments of the present disclosure provide a dual-mode clock and data recovery circuit using oversampling or baud rate and a method of operating the same.

According to one aspect, a clock and data recovery circuit includes an analog front end that receives an external signal and outputs a non-zero return (NRZ) signal, a comparison unit that receives the NRZ signal and compares the NRZ signal with a reference voltage to generate a phase of the external signal and data, a phase detector that determines a transmission rate of the data based on the phase and generates a first recovery signal and a second recovery signal based on the transmission rate of the data, and an oscillator that generates a first clock in an oversampling scheme based on the first recovery signal and generates a second clock in a baud rate scheme based on the second recovery signal.

According to an embodiment, the phase detector may generate the first recovery signal when the transmission rate of the data is equal to or less than a determination reference, and generate the second recovery signal when the transmission rate of the data exceeds the determination reference.

According to an embodiment, the comparison unit may perform sampling at CK0 and CK180 timings according to the first clock generated based on the first recovery signal.

According to an embodiment, the comparison unit may perform sampling at CK0 timing according to the second clock generated based on the second recovery signal.

According to an embodiment, the clock and data recovery circuit may further include an adaptation engine that applies a least mean square algorithm to the analog front end.

According to another aspect, a method of operating a clock and data recovery circuit includes receiving an external signal and outputting a non-zero return (NRZ) signal, receiving the NRZ signal and comparing the NRZ signal with a reference voltage to generate a phase of the external signal and data, determining a transmission rate of the data based on the phase and generating a first recovery signal and a second recovery signal based on the transmission rate of the data, and generating a first clock in an oversampling scheme based on the first recovery signal and generating a second clock in a baud rate scheme based on the second recovery signal.

According to an embodiment, the generating of the first recovery signal and the second recovery signal may include generating the first recovery signal when the transmission rate of the data is equal to or less than a determination reference, and generating the second recovery signal when the transmission rate of the data exceeds the determination reference.

According to an embodiment, the generating of the phase and the data may include performing sampling at CK0 and CK180 timings according to the first clock generated based on the first recovery signal.

According to an embodiment, the generating of the phase and the data may include performing sampling at CK0 timing according to the second clock generated based on the second recovery signal.

According to an embodiment, the method may further include applying a least mean square algorithm to the analog front end.

The dual-mode clock and data recovery circuit according to the embodiments of the present disclosure may selectively use an oversampling scheme and a baud rate scheme depending on the data transmission rate, thereby operating at high speed and reducing the clock range at the same time to reduce the power consumption of the overall circuit.

BRIEF DESCRIPTION OF THE FIGURES

The above and other objects and features of the present disclosure will become apparent by describing in detail embodiments thereof with reference to the accompanying drawings.

FIG. 2 is a simplified diagram of a clock and data recovery circuit according to an embodiment of the present disclosure.

DETAILED DESCRIPTION

Hereinafter, embodiments of the present disclosure will be described clearly and in detail so that those skilled in the art can easily carry out embodiments of the present disclosure.

Figure 1:
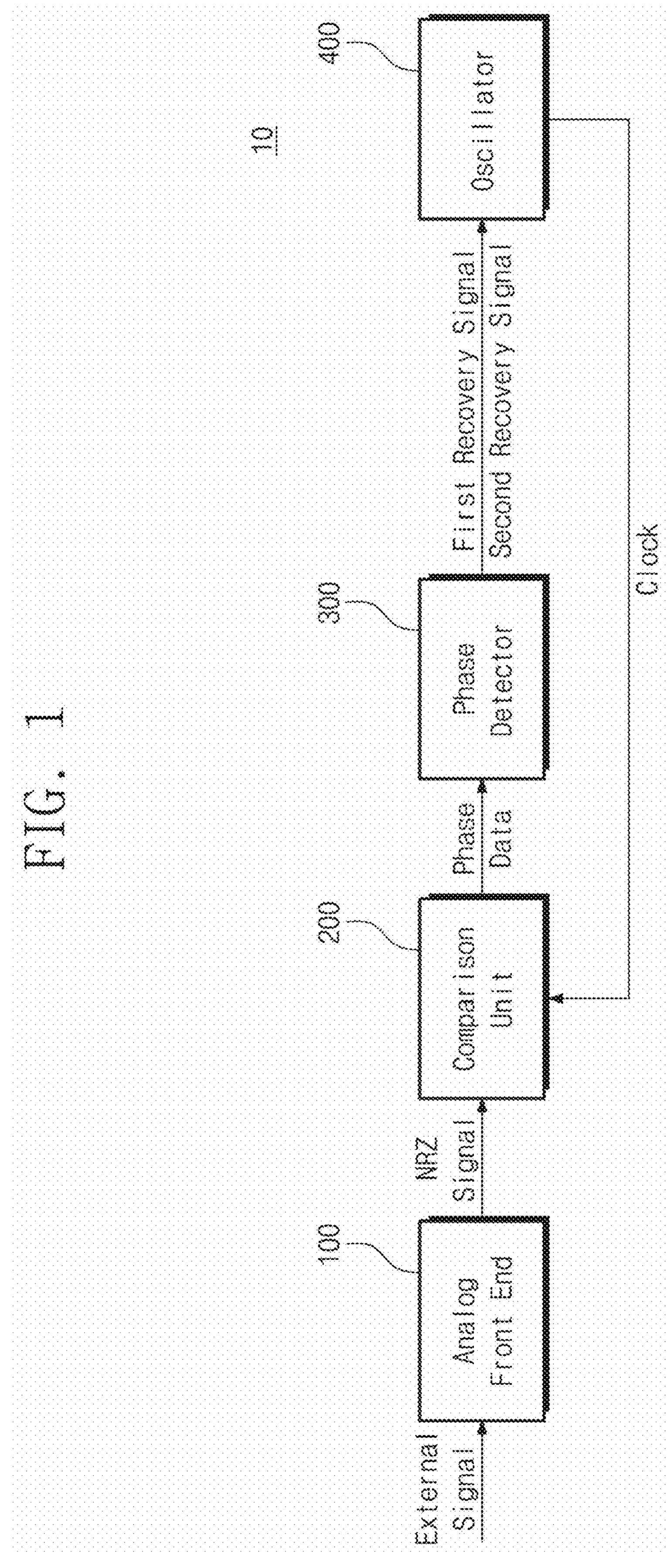
FIG. 1 is a block diagram illustrating a clock and data recovery circuit according to an embodiment of the present disclosure.

FIG. 1 is a block diagram illustrating a clock and data recovery circuit according to an embodiment of the present disclosure.

Referring to FIG. 1, a clock and data recovery circuit 10 may include an analog front end 100, a comparison unit 200, a phase detector 300, and an oscillator 400.

The clock and data recovery circuit 10 according to an embodiment may be understood as a circuit that restores a signal received by a receiver. For example, the clock and data recovery circuit 10 may be used in interfaces such as universal serial bus (USB), peripheral component interconnect (PCI) express, displays, and the like and communication equipment.

The analog front end 100 may receive an external signal. The analog front end 100 may recover channel loss from the received external signal to output a non-zero return (NRZ) signal.

The comparison unit 200 may receive the NRZ signal and compare the NRZ signal with a reference voltage to generate the phase of the external signal and data. In an embodiment, the comparison unit 200 may include a plurality of comparators. In this case, each of the comparators may be a phase comparator that compares the NRZ signal and the reference voltage.

The phase detector 300 may determine a transmission rate of the data based on the phase. Furthermore, the phase detector 300 may generate a first recovery signal and a second recovery signal based on the data transmission rate. In this case, the reference for determining the data transmission rate may be preset.

For example, the phase detector 300 may generate the first recovery signal when the data transmission rate is 4 Gb/s or less, and generate the second recovery signal when the data transmission rate is greater than 4 Gb/s. However, this is only an example and the embodiment is not limited thereto.

The oscillator 400 may generate a clock based on the first recovery signal and the second recovery signal output from the phase detector 300. In addition, the oscillator 400 may input the generated clock to the comparison unit 200.

In an embodiment, the oscillator 400 may generate a first clock in an oversampling scheme based on the first recovery signal. In this case, oversampling may be performed at a rate of 2×, but the embodiment is not limited thereto.

For example, when generating the first clock in a 2× oversampling scheme, the oscillator 400 may generate a clock by using an additional phase or frequency to restore the data when there is a data transition.

In addition, the oscillator 400 may generate a second clock in a baud rate scheme based on the second recovery signal. For example, when generating the second clock in the baud rate scheme, the oscillator 400 may restore data without any additional phases.

In an embodiment, the oscillator 400 may include a digitally controlled oscillator (DCO) that is adjustable with a digital value. The oscillator 400 may receive the first recovery signal and the second recovery signal which are digital values, and generate a clock after adjusting clock timing.

As described above, the clock and data recovery circuit 10 may reduce the range of a clock by generating the clock according to the first recovery signal and the second recovery signal. In other words, the clock and data recovery circuit 10 may reduce power consumption by reducing the clock range corresponding to the data transmission rate.

FIG. 2 is a simplified diagram of a clock and data recovery circuit according to an embodiment of the present disclosure. The limitations below are illustrative only and the embodiment is not limited thereto.

Referring to FIG. 2, the clock and data recovery circuit 10 may generate a first clock based on the first recovery signal in a 2× oversampling scheme when the data transmission rate is 4 Gb/s or less. In addition, the clock and data recovery circuit may generate a second clock based on the second recovery signal in a baud rate scheme when the data transmission rate exceeds 4 Gb/s. Thus, the clock and data recovery circuit 10 may use a clock of 1 to 2 GHz in the range of 2 to 8 Gb/s. In other words, the frequency range of the oscillator 400 is reduced and a clock of up to 2 GHz is generated, so it may be implemented with low power.

Figure 3A:
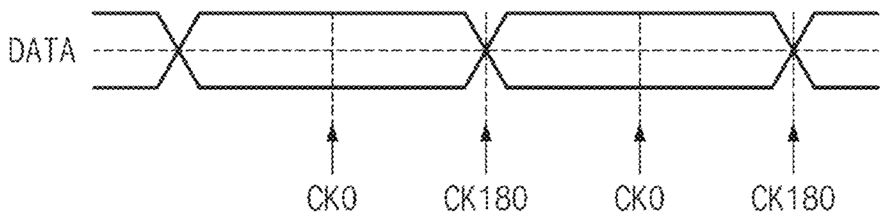
FIGS. 3A and 3B are diagrams illustrating an example of a clock generation scheme according to an embodiment of the present disclosure.
Figure 3B:
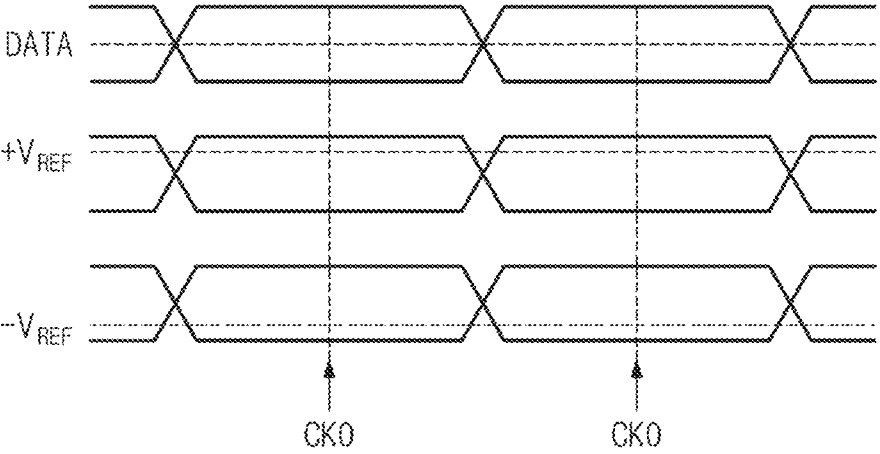

FIGS. 3A and 3B are diagrams illustrating an example of a clock generation scheme according to an embodiment of the present disclosure. In more detail, FIG. 3A illustrates a 2× oversampling clock generation scheme, and FIG. 3B illustrates a baud rate clock generation scheme.

Referring to FIG. 3A, the comparison unit 200 may use an eye diagram of the NRZ signal to restore data. For example, the comparison unit 200 may receive the clock generated from the oscillator 400 based on the first recovery signal, that is, the first clock generated in the 2× oversampling scheme, and perform sampling at the CK0 timing when the eye pattern is largest in the eye diagram.

In addition, the comparison unit 200 may perform sampling by using an additional phase at the CK180 timing.

Referring to FIG. 3B, the comparison unit 200 may receive a clock generated from the oscillator 400 based on the second recovery signal, that is, the second clock generated in the baud rate scheme, and compare the clock signal with a reference voltage Vref to perform sampling at the CK0 timing when the eye pattern is formed the largest.

Figure 4A:
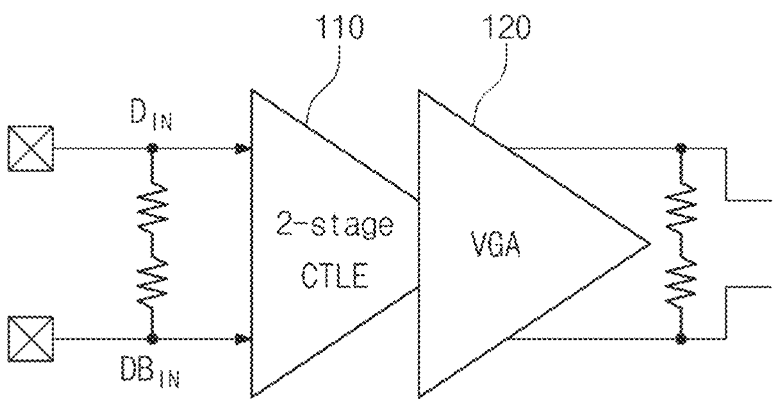
FIGS. 4A and 4B are diagrams illustrating an example of the configuration of an analog front end according to an embodiment of the present disclosure.
Figure 4B:
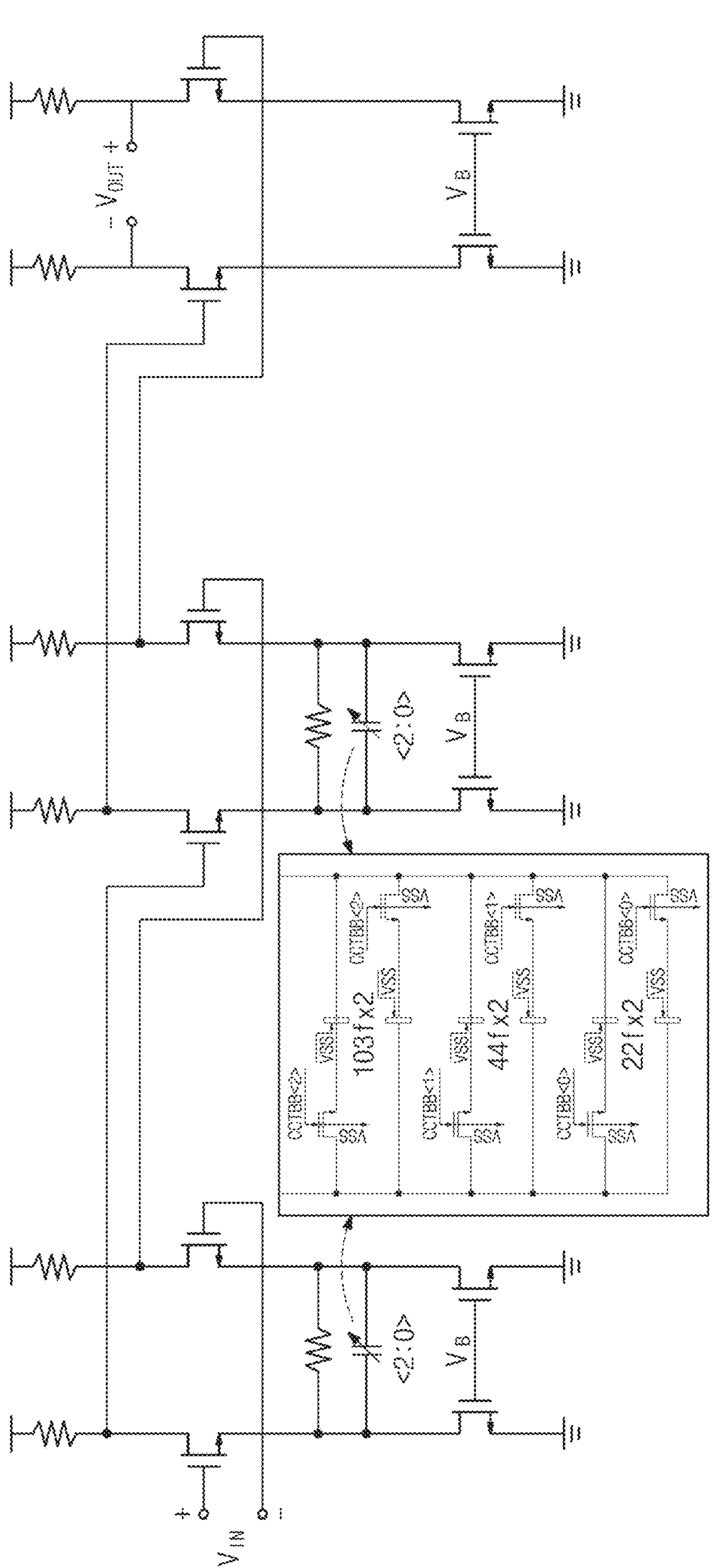

FIGS. 4A and 4B are diagrams illustrating an example of the configuration of an analog front end according to an embodiment of the present disclosure.

Referring to FIGS. 4A and 4B, the analog front end 100 may include an equalizer 110 and an amplifier 120.

The equalizer 110 may adjust all frequency components of the input signal to similar magnitudes (amplitudes). The equalizer 110 may improve jitter and eye diagram performance by amplifying the magnitudes of high frequency components and adjusting the magnitudes (amplitudes) using continuous time linear equalization (CTLE).

The amplifier 120 may amplify the magnitude of the input signal. In this case, the amplifier 120, which is a variable gain amplifier (VGA), may adjust the gain of the signal amplified. The amplifier 120 may amplify the magnitude of the signal and output a positive voltage (VP) and a negative voltage (VN).

Figure 5:
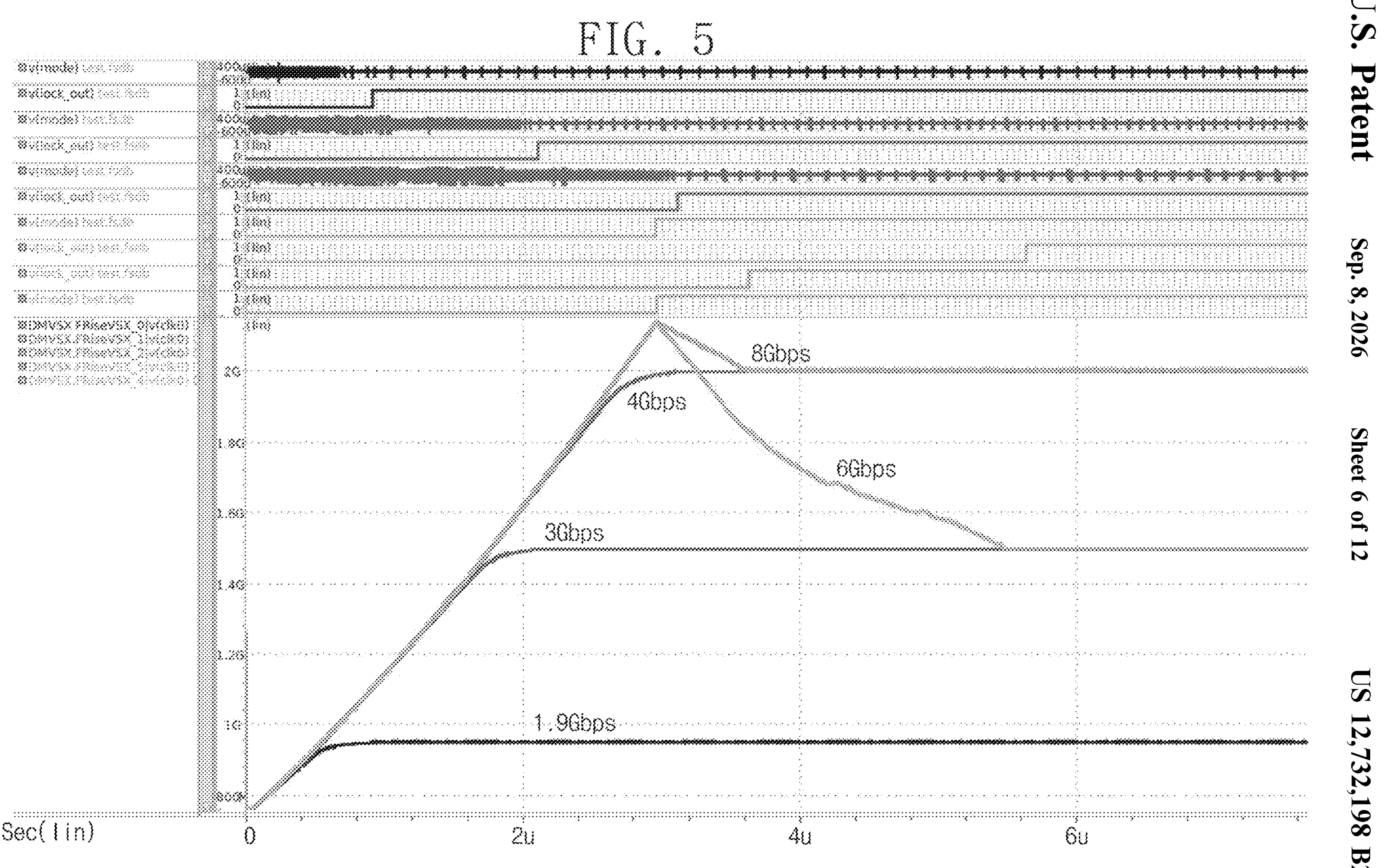
FIG. 5 is a diagram illustrating a simulation result of a clock and data recovery circuit according to an embodiment of the present disclosure.

FIG. 5 is a diagram illustrating a simulation result of a clock and data recovery circuit according to an embodiment of the present disclosure.

Referring to FIG. 5, the phase detector 300 may determine the data transmission rate based on the phase and generate the first recovery signal and the second recovery signal based on the data transmission rate.

In an embodiment, the reference for determining the data transmission rate of the phase detector 300 may be defined as 4 Gb/s. For example, when the data transmission rate is 4 Gb/s, the oscillator 400 may generate the first clock whose clock frequency is fixed to 2 GHz in the 2× oversampling scheme. In addition, when the data transmission rate is 8 Gb/s, the oscillator 400 may generate the second clock whose clock frequency is fixed to 2 GHz in the baud rate scheme.

In addition, when the data transmission rate is 6 Gb/s, the oscillator 400 may generate the second clock whose clock frequency is fixed to 1.5 GHz in the baud rate scheme.

Figure 6:
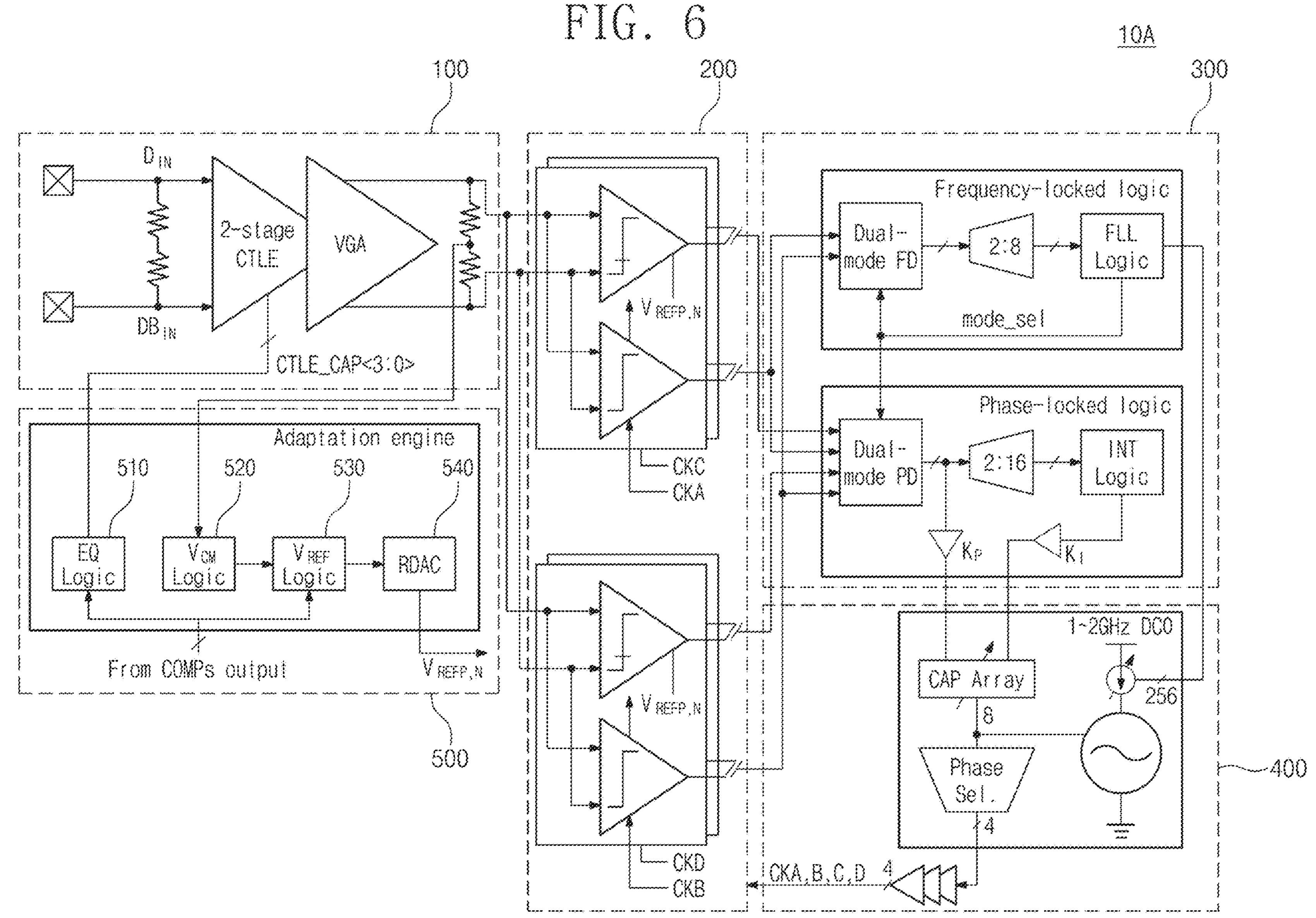
FIG. 6 is a diagram illustrating an example of a clock and data recovery circuit according to another embodiment of the present disclosure.

FIG. 6 is a diagram illustrating an example of a clock and data recovery circuit according to another embodiment of the present disclosure. A clock and data recovery circuit 10A of FIG. 6 is similar to that of FIG. 1. Accordingly, identical or similar components are denoted by identical or similar reference numerals, and overlapping descriptions will be omitted hereinafter.

Referring to FIG. 6, the clock and data recovery circuit 10A may further include an adaptation engine 500.

The adaptation engine 500 may include a first logic 510, a second logic 520, a third logic 530, and a resistive digital-to-analog converter (RDAC) 540.

The first logic 510, which is EQ logic, may be implemented as a sign-sign least mean square (SSLMS) algorithm. The first logic 510 may calculate an error signal by comparing the input signal and the output signal.

The second logic 520 may control the size of a weight by using the logic of the common voltage (VCM).

The third logic 530 may set a reference point of the weight by using the logic of the reference voltage VREF. For example, when the weight reference point is too high or too low, signal distortion may occur, so the third logic 530 may control the weight reference point to be maintained within an appropriate range.

The RDAC 540 may convert the weight from a digital signal to an analog signal. In addition, the RDAC 540 may input the converted analog signal to the equalizer 110.

Accordingly, the adaptation engine 500 may restore the signal by compensating for the influence of the channel using the SSLMS algorithm. It may be understood that the SSLMS algorithm uses a weight to adjust the phase and amplitude of a signal, thereby restoring the distorted signal due to the influence of a channel and opening the eye of an eye diagram.

Figure 7A:
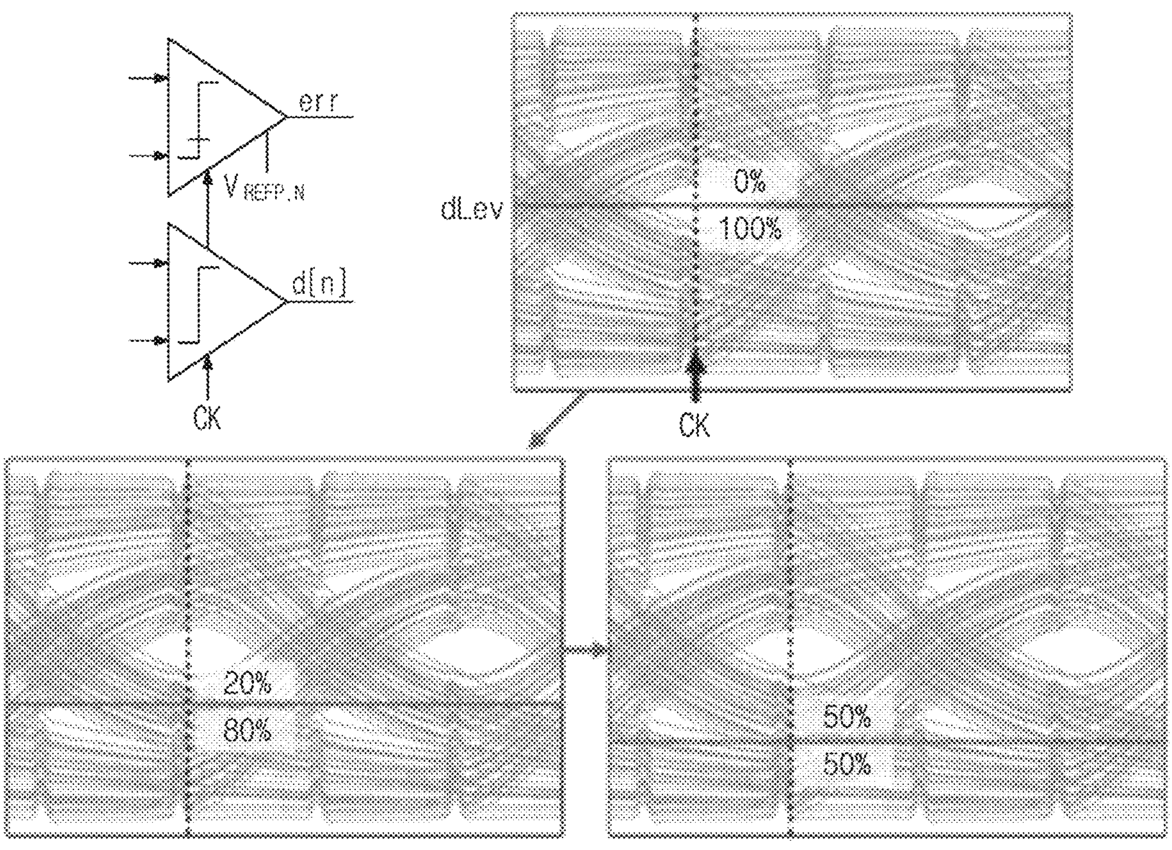
FIGS. 7A and 7B are diagrams illustrating a simulation result of an adaptation engine according to another embodiment of the present disclosure.
Figure 7B:
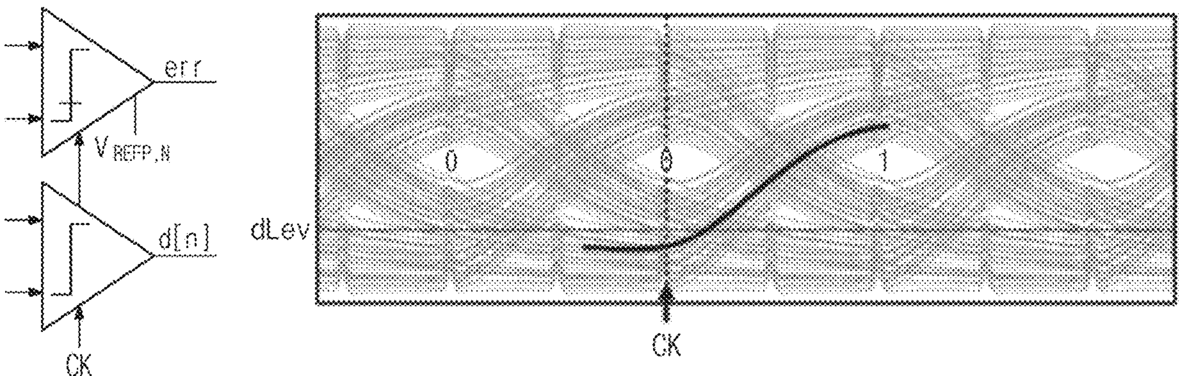

FIGS. 7A and 7B are diagrams illustrating a simulation result of an adaptation engine according to another embodiment of the present disclosure.

Referring to FIGS. 7A and 7B, the adaptation engine 500 may adjust the phase and amplitude of a signal by using a weight reference point. For example, the adaptation engine 500 may adjust VREFP and VREFN to adapt a data-level reference (dLeV), which is a weight reference point. The adaptation engine 500 may use the SSLMS algorithm such that when the NRZ signal, which is the output of the amplifier 120, is '0 (zero)', the probability that the error Err is '0' and '1' is set to 50%.

In addition, while adjusting the capacitor of the equalizer 110 to adapt the equalizer 110, when three consecutive data are 0, 0 and 1 or 1, 0 and 0, the adaptation engine 500 may use the SSLMS algorithm such that the probability that the error is '0' and '1' is set to 50%.

Figure 8:
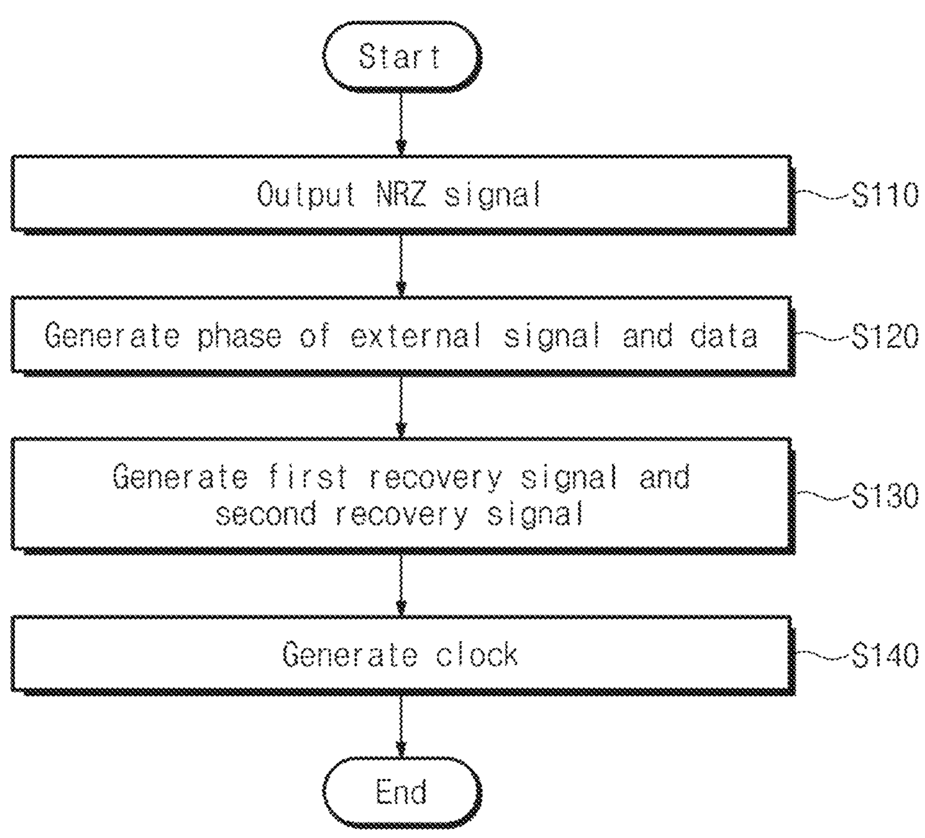
FIG. 8 is a flowchart illustrating the operation of a clock and data recovery circuit according to an embodiment of the present disclosure.

FIG. 8 is a flowchart illustrating the operation of a clock and data recovery circuit according to an embodiment of the present disclosure.

Referring to FIG. 8, in operation S110, the analog front end 100 may receive an external signal. The analog front end 100 may recover channel loss from a received external signal and output an NRZ signal.

In operation S120, the comparison unit 200 may receive the NRZ signal and compare the NRZ signal with a reference voltage to generate the phase of the external signal and data.

In operation S130, the phase detector 300 may determine the transmission rate of the data based on the phase and generate a first recovery signal and a second recovery signal based on the transmission rate of the data.

In operation S140, the oscillator 400 may generate a clock based on the first recovery signal and the second recovery signal output from the phase detector 300.

Figure 9:
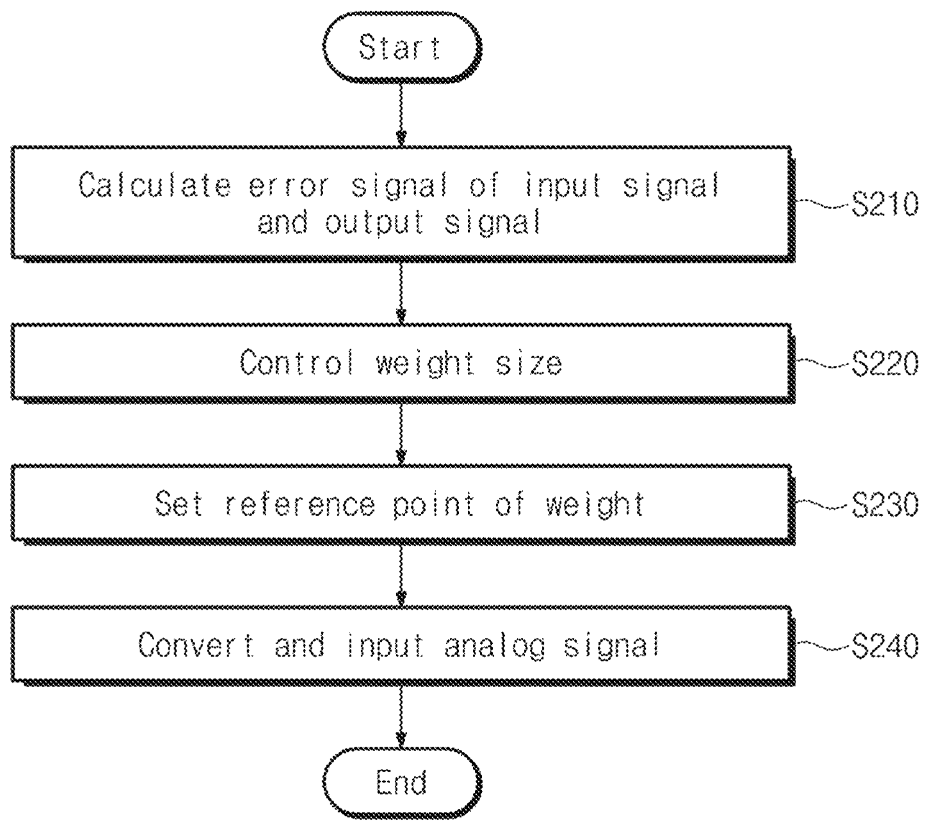
FIG. 9 is a flowchart illustrating an operation of an adaptation engine according to another embodiment of the present disclosure.

FIG. 9 is a flowchart illustrating an operation of an adaptation engine according to another embodiment of the present disclosure.

Referring to FIG. 9, in operation S210, the first logic 510 may calculate an error signal by comparing the input signal and the output signal.

In operation S220, the second logic 520 may control the size of the weight by logic of the common voltage VCM.

In operation S230, the third logic 530 may set the reference point of the weight by using the logic of the reference voltage VREF.

In operation S240, the RDAC 540 may convert the weight from a digital signal to an analog signal. In addition, the RDAC 540 may input the converted analog signal to the equalizer 110.

Figure 10:
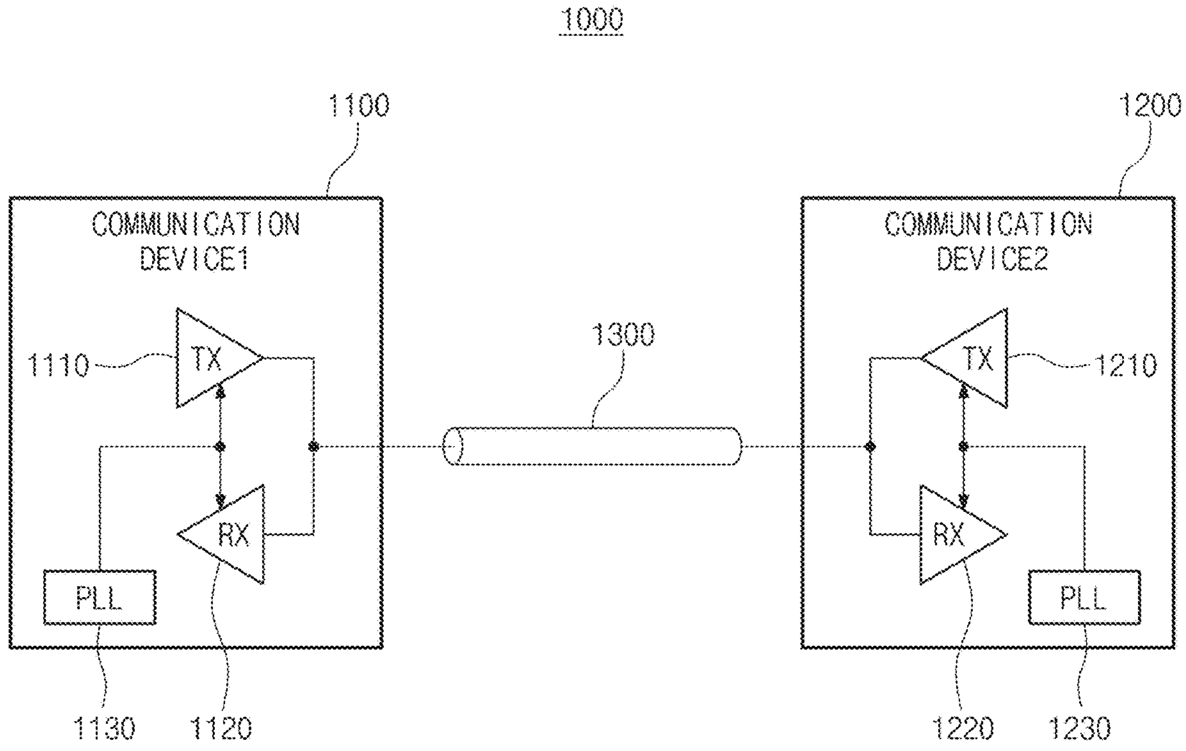
FIG. 10 is a block diagram illustrating a communication device and a communication system including the same according to embodiments of the present disclosure.

FIG. 10 is a block diagram illustrating a communication device and a communication system including the same according to embodiments of the present disclosure.

Referring to FIG. 10, a communication system 1000 includes a first communication device 1100, a second communication device 1200, and a channel 1300.

The first communication device 1100 includes a first transmitter 1110, a first receiver 1120, and a first phase locked loop 1130. The second communication device 1200 includes a second transmitter 1210, a second receiver 1220, and a second phase locked loop 1230. The first transmitter 1110 and the first receiver 1120, and the second transmitter 1210 and the second receiver 1220 are connected through the channel 1300. According to an embodiment, each of the first and second communication devices 1100 and 1200 may include a plurality of transmitters and a plurality of receivers, and may include a plurality of channels for connecting them.

The first transmitter 1110 generates and outputs a data signal to be transmitted to the second communication device 1200, and the second receiver 1220 receives the data signal provided through the channel 1300. Similarly, the second transmitter 1210 generates and outputs a data signal to be transmitted to the first communication device 1100, and the first receiver 1120 receives the data signal provided through the channel 1300.

The first phase locked loop 1130 may generate reference clock signals supplied to the first transmitter 1110 and the first receiver 1120, and the second phase locked loop 1230 may generate reference clock signals supplied to the second transmitter 1210 and the second receiver 1220. In other words, the first transmitter 1110 and the first receiver 1120 may share the first phase locked loop 1130, and the second transmitter 1210 and the second receiver 1220 may share the second phase locked loop 1230. The first communication device 1100 and/or the second communication device 1200 may perform a target operation (i.e., the operation to be executed) based on the received data signal.

The receivers 1120 and 1220 may include a phase interpolation-based clock data recovery circuit according to embodiments of the present disclosure, and perform a clock data recovery method according to embodiments of the present disclosure. In other words, the receivers 1120 and 1220 may be implemented to have a function of removing the frequency modulation component generated by the phase locked loops 1130 and 1230.

Specific embodiments have been described above. In addition to the above-described embodiments, the present disclosure may include simple design changes or easily changeable embodiments. In addition, the present disclosure may include techniques that can easily modify and implement the embodiments. Therefore, the scope of the present disclosure should not be limited to the above-described embodiments, but should be defined by the claims described below as well as the claims and equivalents.

This work was supported by the National Research Foundation of Korea (NRF) grate funded by the Korea government (MSIT) (No. NRF-2022R1A2C3012245).

What is claimed is:

1. A clock and data recovery circuit comprising:

an analog front end configured to receive an external signal and output a non-zero return (NRZ) signal;

a phase comparator configured to receive the NRZ signal and compare the NRZ signal with a reference voltage to generate a phase of the external signal and data;

a phase detector configured to determine a transmission rate of the data based on the phase and generate a first recovery signal and a second recovery signal based on the transmission rate of the data; and an oscillator configured to generate a first clock in an oversampling scheme based on the first recovery signal and generate a second clock in a baud rate scheme based on the second recovery signal.

2. The clock and data recovery circuit of claim 1, wherein the phase detector is configured to:

generate the first recovery signal when the transmission rate of the data is equal to or less than a determination reference; and generate the second recovery signal when the transmission rate of the data exceeds the determination reference.

3. The clock and data recovery circuit of claim 2, wherein the phase comparator is configured to perform sampling at CK0 and CK180 timings according to the first clock generated based on the first recovery signal, wherein the CK0 timing is a timing at a 0-degree phase of the first clock and the CK180 timing is a timing at a 180-degree phase of the first clock.

4. The clock and data recovery circuit of claim 2, wherein the phase comparator is configured to perform sampling at CK0 timing according to the second clock generated based on the second recovery signal, wherein the CK0 timing is a timing at a 0-degree phase of the second clock.

5. The clock and data recovery circuit of claim 1, further comprising:

an adaptation circuitry configured to apply a least mean square algorithm to the analog front end.

6. A method of operating a clock and data recovery circuit, the method comprising:

receiving an external signal and outputting a non-zero return (NRZ) signal;

receiving the NRZ signal and comparing the NRZ signal with a reference voltage to generate a phase of the external signal and data;

determining a transmission rate of the data based on the phase and generating a first recovery signal and a second recovery signal based on the transmission rate of the data; and generating a first clock in an oversampling scheme based on the first recovery signal and generating a second clock in a baud rate scheme based on the second recovery signal.

7. The method of claim 6, wherein the generating of the first recovery signal and the second recovery signal includes:

generating the first recovery signal when the transmission rate of the data is equal to or less than a determination reference; and generating the second recovery signal when the transmission rate of the data exceeds the determination reference.

8. The method of claim 7, wherein the generating of the phase and the data includes performing sampling at CK0 and CK180 timings according to the first clock generated based on the first recovery signal, wherein the CK0 timing is a timing at a 0-degree phase of the first clock and the CK180 timing is a timing at a 180-degree phase of the first clock.

9. The method of claim 7, wherein the generating of the phase and the data includes performing sampling at CK0 timing according to the second clock generated based on the second recovery signal, wherein the CK0 timing is a timing at a 0-degree phase of the second clock.

10. The method of claim 6, further comprising:

applying a least mean square algorithm to an analog front end of the clock and data recovery circuit.

* * * * *